(12) United States Patent
Lai et al.

(10) Patent No.: US 6,413,815 B1
(45) Date of Patent: Jul. 2, 2002

(54) METHOD OF FORMING A MIM CAPACITOR

(75) Inventors: Erh-Kun Lai, Tai-Chung Hsien; Shyi-Shuh Pan, Kao-Hsiung; Chien-Hung Liu, Taipei; Shou-Wei Huang, Chi-Lung; Ying-Tso Chen, Kao-Hsiung Hsien, all of (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 09/682,069

(22) Filed: Jul. 17, 2001

(51) Int. Cl.[7] .......................................... H01L 21/8242
(52) U.S. Cl. ...................................... 438/243; 438/386
(58) Field of Search .................................. 438/243, 386, 438/239, 250, 253, 745, 393

(56) References Cited

U.S. PATENT DOCUMENTS 6,271,084 B1 * 8/2001 Tu et al. ...................... 438/253
6,329,234 B1 * 12/2001 Ma et al. ..................... 438/210

* cited by examiner

Primary Examiner—David Nelms
Assistant Examiner—Thao P Le
(74) Attorney, Agent, or Firm—Winston Hsu

(57) ABSTRACT

A method of simultaneously forming a dual damascence runner and a metal-insulator-metal (MIM) capacitor on a semiconductor wafer. The semiconductor wafer has a first dielectric layer, which has at least a first conductive layer and at least a bottom electrode of the MIM capacitor. The surfaces of the first conductive layer and the bottom electrode of the MIM capacitor are covered with a barrier layer. A second dielectric layer, a stop layer and a third dielectric layer are formed on the surface of the barrier layer and form a sandwiched structure. A first photoresist layer is formed and the third dielectric layer is anisotropically etched down to the stop layer, thus forming a trench and an opening in the third dielectric layer above the conductive layer and the bottom electrode of the MIM capacitor. A second photoresist layer is formed and the stop layer and the second dielectric layer are etched at a bottom of the opening down to the surface of the barrier layer so as to form an opening of the top electrode. A third photoresist layer is formed and the stop layer, the second dielectric layer and the barrier layer are etched through the contact opening down to the surface of the first conductive layer so as to form a contact hole.

9 Claims, 8 Drawing Sheets

METHOD OF FORMING A MIM CAPACITOR

BACKGROUND OF INVENTION

1. Field of the Invention

The present invention relates to a method of forming a metal-insulator-metal (MIM) capacitor on a semiconductor wafer, and more particularly, to a method of forming a metal-insulator-metal capacitor having low resistivity and being compatible with a dual damascene process metal runner.

2. Description of the Prior Art

A dual damascene process starts by making a trench and a via underneath the trench. A single metal layer is deposited to fill the trench and the via. Then, a chemical mechanical polish(CMP) process is performed to simultaneously form a metal runner and a plug with up and down piled structure. The dual damascene structure is used to connect different devices and runners, in various levels on a semiconductor wafer, and isolate them from other devices by forming inter-layer dielectrics around them.

The dual-damascene structure has the following advantages: 1) since a chemical mechanical polishing process finishes the process of making the dual damascene structure, the surface of the semiconductor wafer is extremely flat, which is very helpful in subsequent deposition and photolithography processes; 2) when preparing the inter-metal connection between the two metal layers, the openings of the metal line, and the via underneath the metal line, are formed during the same photolithography process, so the number of process steps can be reduced and the size of the device can be controlled more accurately; 3) the metal etching process step can be omitted, so the problem of volatile species not being easily expelled, as a result of metal etching, can be avoided. Therefore, the dual damascene structure is broadly applied in the manufacturing of integrated circuits. With the increasingly accurate and complex development of integrated circuits, it is a very important issue to lift the yield rate of the dual damascene structure.

In U.S. Pat. No. 6,037,664, Zhao et al. proposes a basic method of manufacturing dual damascene. Please refer to FIG. 1 to FIG. 9. FIG. 1 to FIG. 9 are schematic diagrams of a process for making a dual damascene structure 30 and an inter-metal connection 36 according to the prior art. As shown in FIG. 1, a semiconductor wafer 10 comprises a substrate 11 and an inter-layer dielectric (ILD) 12, the inter-layer dielectric 12 comprises a conductive region 13 and a conductive layer 14 disposed in the conductive region 13. The conductive region 13 is a portion of the lower level metal layer(not shown). Furthermore, the conductive region 13 can be a metal runner, a landing pad, a gate, a drain or a drain formed on the semiconductor wafer 10. A linear layer 15 is set between the conductive layer 14 and the inter-layer dielectric 12. The objective of the linear layer 15 is to isolate the conductive layer 14 and the inter-layer dielectric 12 in order to prevent metal atoms from diffusing into the inter-layer dielectric 12. The linear layer 15 is composed of titanium nitride(TiN), tantalum nitride(TaN) and silicon nitride($Si_3N_4$), etc.

As shown in FIG. 2, a barrier layer 16, a first dielectric layer 18 and a first etch-stop layer 20 are sequentially deposited on the semiconductor wafer 10. The barrier layer 16 is a silicon nitride layer or a silicon dioxide layer and has a thickness of 300~1000 angstoms, depending on the composition of the conductive layer 14. The first dielectric layer 18 is a dielectric layer with a low dielectric constant and a thickness of 500~1000 angstroms. The first etch-stop layer 20 has a thickness of 300~1000 angstroms and its composition is necessarily different from that of the barrier layer 16. Usually a silicon dioxide layer is used.

As shown in FIG. 3, a first photolithography and etching process are performed by applying a first photoresist layer 19 and a first dry etching process. A first opening 21 is formed in the first etch-stop layer 20 above the conductive layer 14, then the first photoresist layer 19 is removed. The first opening 21 is used to form a via hole(not shown) in the subsequent process.

As shown in FIG. 4, a second dielectric layer 22 and a second etch-stop layer 24 on the semiconductor wafer 10 are sequentially deposited. Usually the composition of the second etch-stop layer 24 is the same as the composition of the first etch-stop layer 20. The composition of the second dielectric layer 22 is usually the same as that of the first dielectric layer 18.

As shown in FIG. 5, a second photolithography and etching process are then performed. By applying a second photoresist layer 23 and a second dry etching process, a second opening 25 is formed in the second etch-stop layer 24 above the conductive layer 14 and the first opening 21, then the second photoresist layer 23 is removed. The second opening 25 is used for forming the trench opening (not shown) in the subsequent process.

Then, as shown in FIG. 6, a low pressure plasma etching process, using oxygen as a reaction gas, is performed to remove the second dielectric layer 22 not protected by the second etch-stop layer 24, and to remove the first dielectric layer 18 not covered by the first etch-stop layer 20, down to the surface of the barrier layer 16. Because the compositions of the fist etch-stop layer 20 and the second etch-stop layer 24 are different from the composition of the barrier layer 16, a dual damascence structure 30 comprising a via opening 26 and a trench opening 28 can be formed by adjusting the selectivity. Also, since the barrier layer 16 is intact on the conductive layer 14, the conductive layer 14 can be protected.

Please refer to FIG. 7. A dry etching process, using methyl fluoride($CH_3F$) and oxygen as reaction gases, is then performed to remove the barrier layer 16 at the bottom of the via opening 26. When performing this process step, it is necessary to adjust the selectivity of solutions in order to avoid destroying the first etch-stop layer 20, the second etch-stop layer 24, the first dielectric layer 18 and the second dielectric layer 22.

As shown in FIG. 8, a metal layer 32 is deposited on the semiconductor wafer 10. The metal layer 32 can be a copper metal layer, an aluminum metal layer or other metal layer, and fills in the via opening 26 and the trench opening 28. Before forming the metal layer 32, a barrier layer 31 with a thickness of 100~1000 angstroms can be formed selectively, depending on the composition of the metal layer 32. The barrier layer 31 can be a titanium nitride layer or a tantalum nitride layer, and is used for isolating the metal layer 32 from the first dielectric layer 18 and the second dielectric layer 22.

As shown in FIG. 9, a chemical mechanical polishing process, using the second etch-stop layer 24 as a polish-stop layer, is then performed. The chemical mechanical polishing process removes the barrier layer 31 and the metal layer 32 above the second etch-stop layer 24, and makes the surface of the metal layer 32 and the barrier layer 31 flush with the surface of the second etch-stop layer 24. Finally, a third dielectric layer 34 is deposited. The composition of the third dielectric layer 34 is the same as that of the barrier layer 16.

The third dielectric layer 34 covers the second etch-stop layer 24, the barrier layer 31, and the metal layer 32 processed by the chemical mechanical polishing treatment, to complete the metal runner 36 structure.

In U.S. Pat. No. 6,117,747, Shao et al. proposes a method for forming a metal-oxide-metal(MOM) capacitor by applying the dual damascence process. Although this method can avoid direct contact between a capacitor dielectric layer and a silicon substrate, which incurs the existence of interface trapped charges and results in stretch-out of the C-V curve under high frequency, the process steps are not simplified enough because the bottom metal layer, the oxide layer and the top metal layer still need to be made separately.

Although the method for forming the dual damascence structure 30 according to the prior art has the advantages mentioned above, the process can only produce the metal runner 36. Also the process steps of the method proposed by Shao are very complicated. Therefore, it is important to develop a dual damascence process that is capable of processing other devices, such as a metal-insulator-metal (MIM) capacitor, and is capable of reducing the process steps. Additionally, given the structure of MIM capacitors, when the conductive layer 14 and the metal layer 32 in the dual damascence process are both copper, these two layers can be applied as the top electrode and the bottom electrode, respectively. In this case, the top and the bottom electrodes of the MIM capacitor will have very ideal resistivity values, because the resistivity of copper is very low.

According to the prior art method for forming the dual damascence structure 30, when the conductive layer 14 is composed of a non-copper metal, usually a silicon dioxide layer together with a metal layer are used as the barrier layer 16. In the subsequent etching process of via opening 26, the silicon dioxide layer is applied as the etch-stop layer. However, when the conductive layer is a copper metal layer, usually a silicon nitride layer is used as the barrier layer 16 and the etch-stop layer in subsequent via opening etching processes. In the manufacturing process of the MIM capacitor compatible with the metal runner dual damascence process, these characteristics can be applied. So, there is no need to do an extra deposition for an isolation layer as the dielectric layer of the MIM, as the silicon nitride layer can be applied as the dielectric layer of the MIM directly. At the same time, due to the dielectric constant ($\in$) for silicon nitride layer being higher than that of the silicon dioxide layer, more charges can be stored under the same applied voltage. Making a MIM capacitor using silicon nitride as dielectric layer will also occupy less area on chip than the MIM capacitor with a silicon dioxide dielectric layer, so chip size also shrinks. Therefore, it is very important to develop a MIM capacitor with low resistivity electrodes and the above mentioned advantages, compatible to the copper runner dual damascence manufacturing process.

SUMMARY OF INVENTION

It is therefore a primary objective of the present invention to provide a method of forming a metal-insulator-metal (MIM) capacitor on a semiconductor wafer, the MIM capacitor being compatible with a copper runner dual damascence process.

The method according to the present invention provides a method of simultaneously forming a dual damascence runner and a metal-insulator-metal capacitor on a semiconductor wafer. The semiconductor wafer comprises a first dielectric layer, at least one first conductive layer, and at least one bottom electrode disposed in the first dielectric layer. A barrier layer covers the surface of the first conductive layer and the bottom electrode of the MIM capacitor. First, a second dielectric layer, a stop layer and a third dielectric layer on the barrier layer are sequentially formed. The second dielectric layer, the stop layer and the third dielectric layer together form a sandwiched structure. Thereafter, a first photoresist layer is formed on the surface of the third dielectric layer. The third dielectric layer not covered by the first photoresist layer is anisotropically etched down to the stop layer, forming a trench and an opening in the third dielectric layer above the first conductive layer and the bottom electrode of the MIM capacitor, respectively. The first photoresist layer is removed completely, a second photoresist layer is formed on the surface of the semiconductor wafer. The stop layer and the second dielectric layer are etched at a bottom of the opening down to the barrier layer, forming a top electrode opening of the MIM capacitor in the third dielectric layer, the stop layer and the second dielectric layer. The second photoresist layer is removed and a third photoresist layer is formed on the surface of the semiconductor wafer. Then, the stop layer, the second dielectric layer and the barrier layer are etched through the contact opening, down to the surface of the conductive layer, forming a contact hole in the stop layer, the second dielectric layer and the barrier layer. The third photoresist layer is then removed. Finally, a metal barrier layer and a copper metal layer are formed. The copper metal layer fills in the contact hole, the trench and the opening of the top electrode of the MIM capacitor. Then, a chemical mechanical polishing process is performed, and an isolation layer is deposited, to complete the manufacturing of the copper runner and the MIM capacitor, respectively.

It is an advantage of the present invention that the method of forming the dual damascence structure will simultaneously form the MIM capacitor and the copper runner. Not only is the number of process steps reduced, but the resistivity value of the top and bottom electrodes are also reduced, and the chip size is shrunk.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
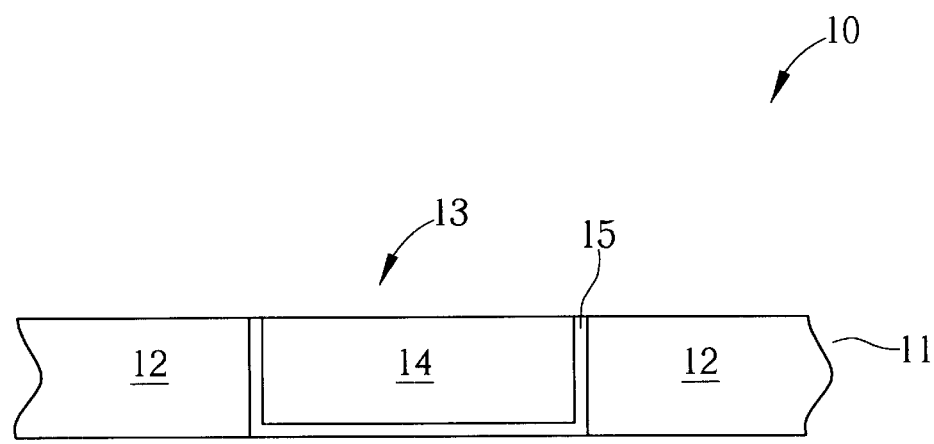
FIG. 1 to FIG. 9 are schematic diagrams of a process for forming a dual damascence structure and an inter-metal connection according to the prior art.
Figure 2:
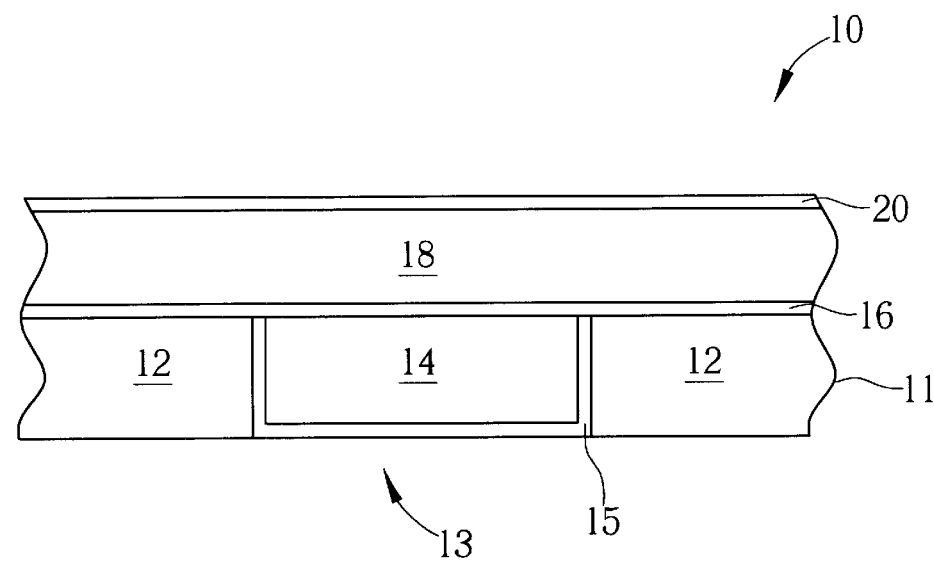
Figure 3:
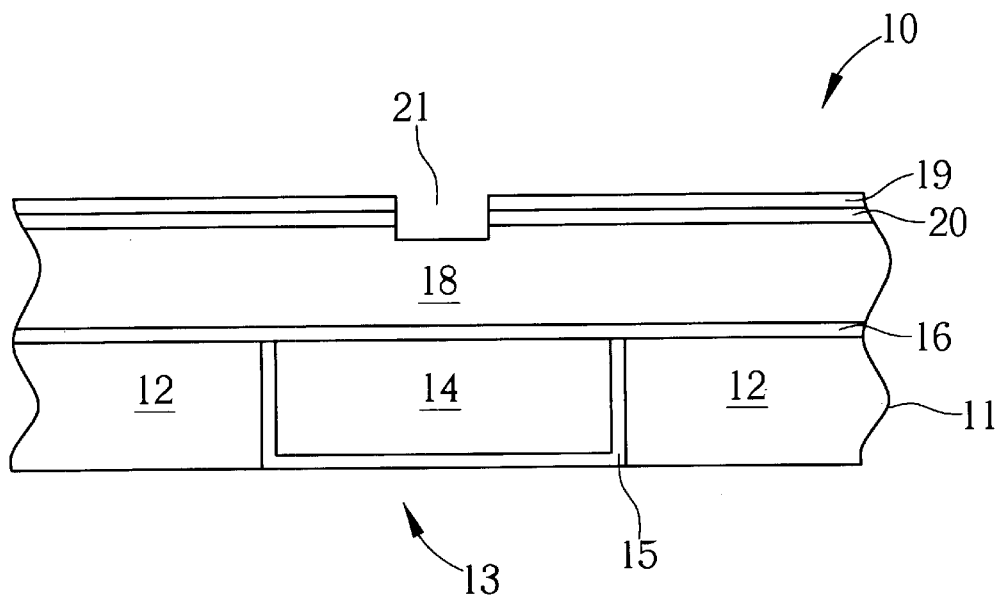
Figure 4:
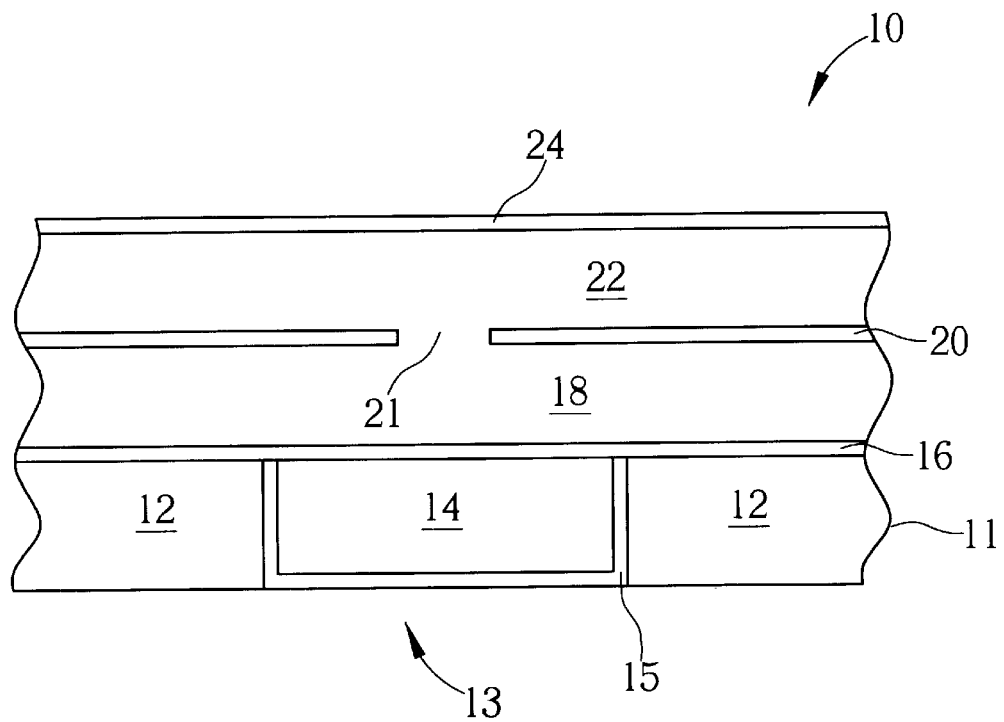
Figure 5:
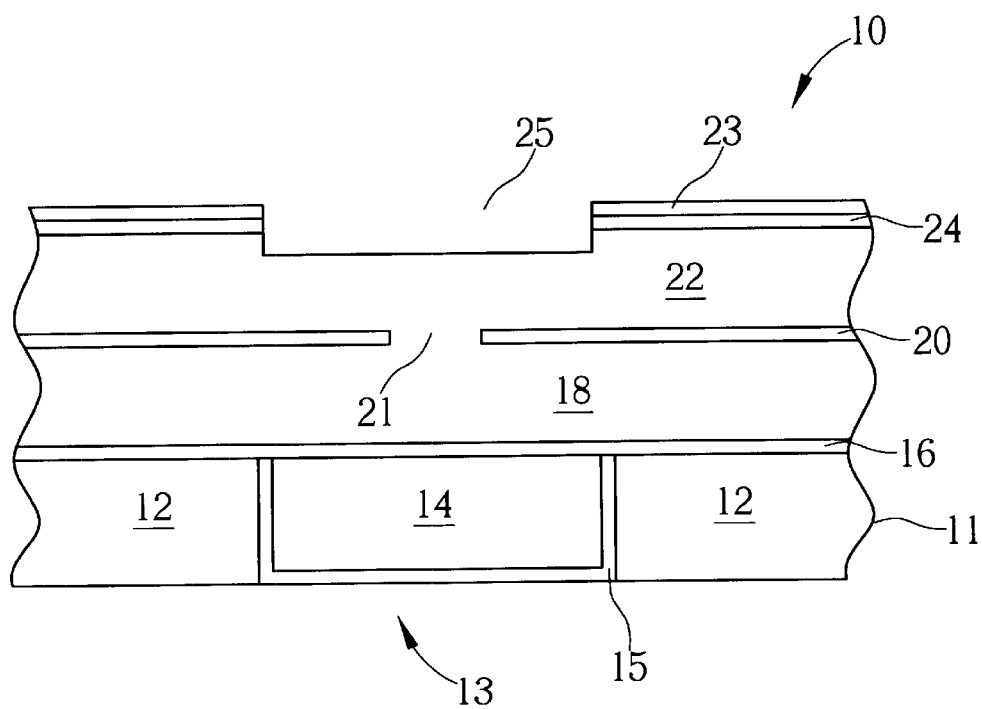
Figure 6:
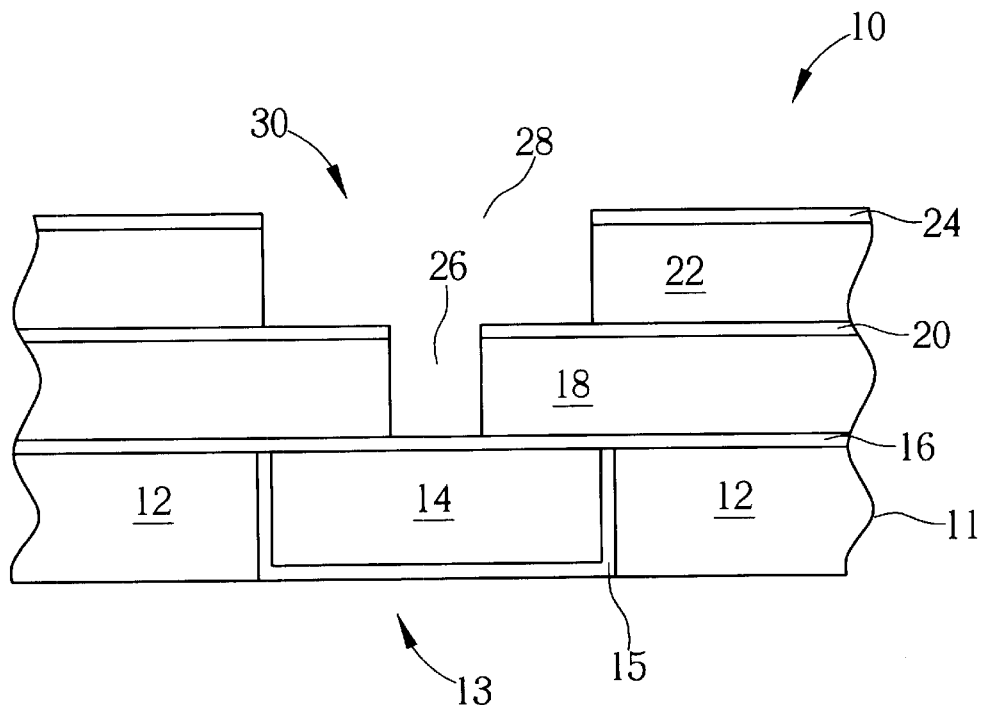
Figure 7:
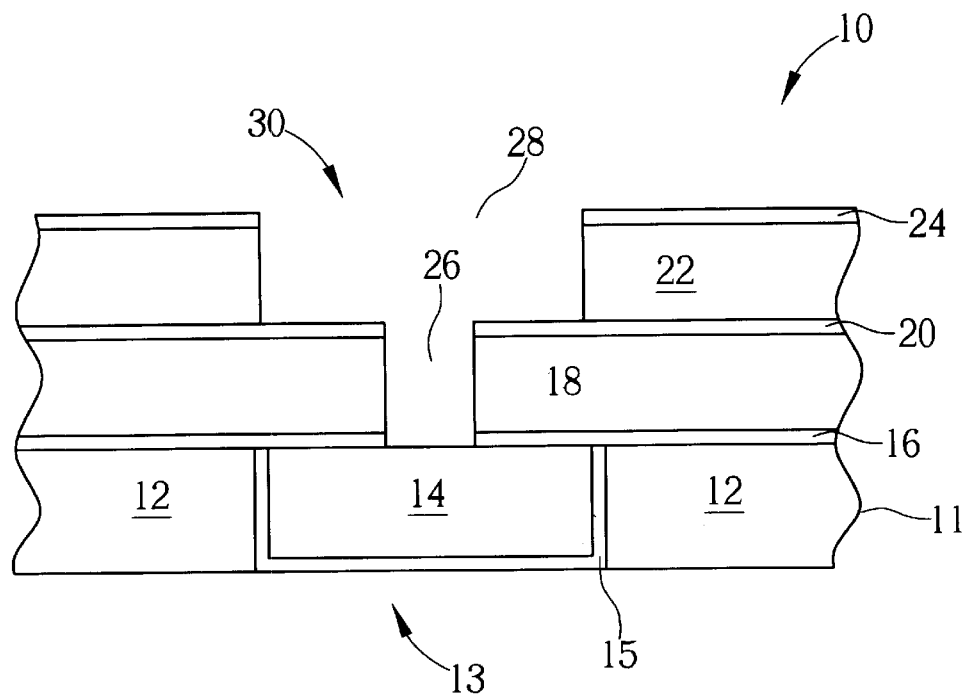
Figure 8:
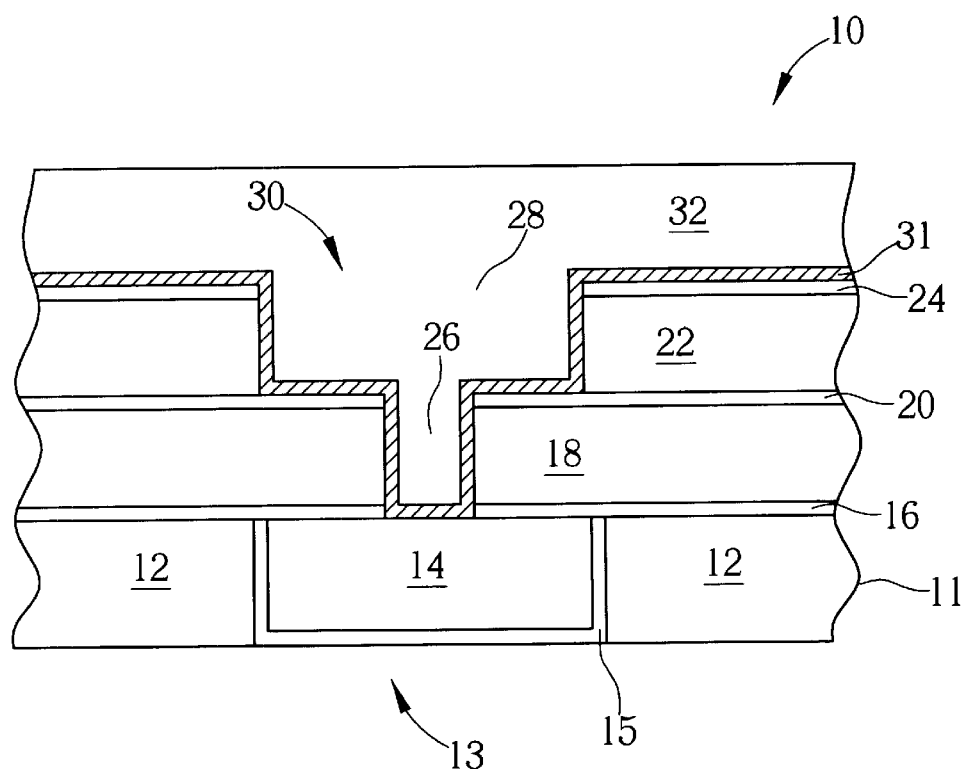
Figure 9:
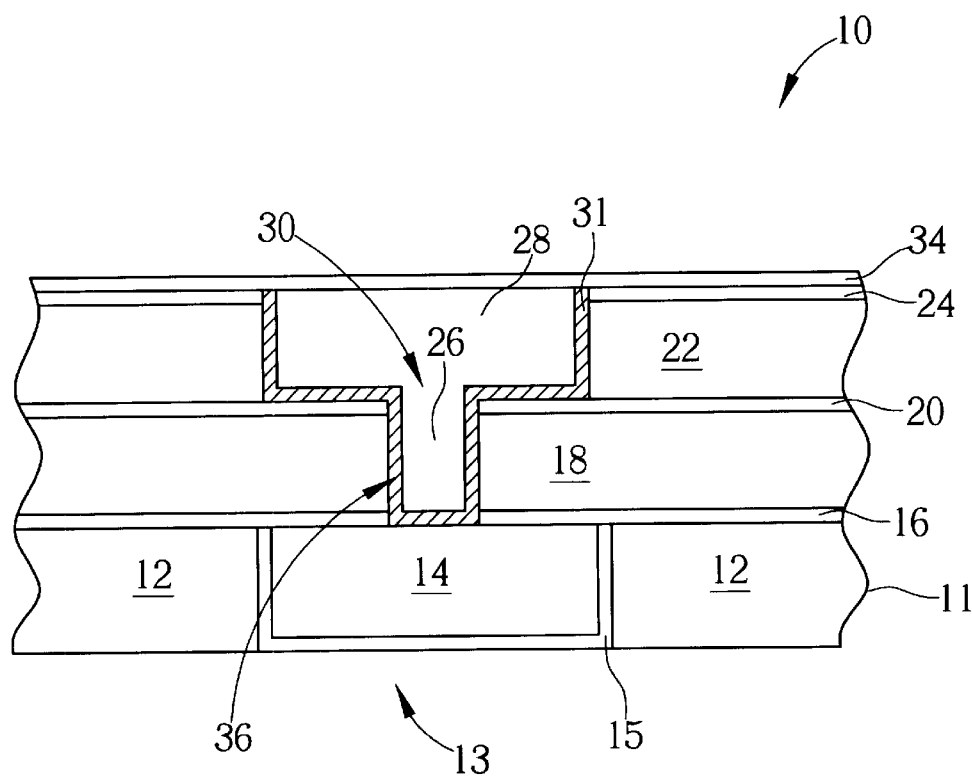
Figure 10:
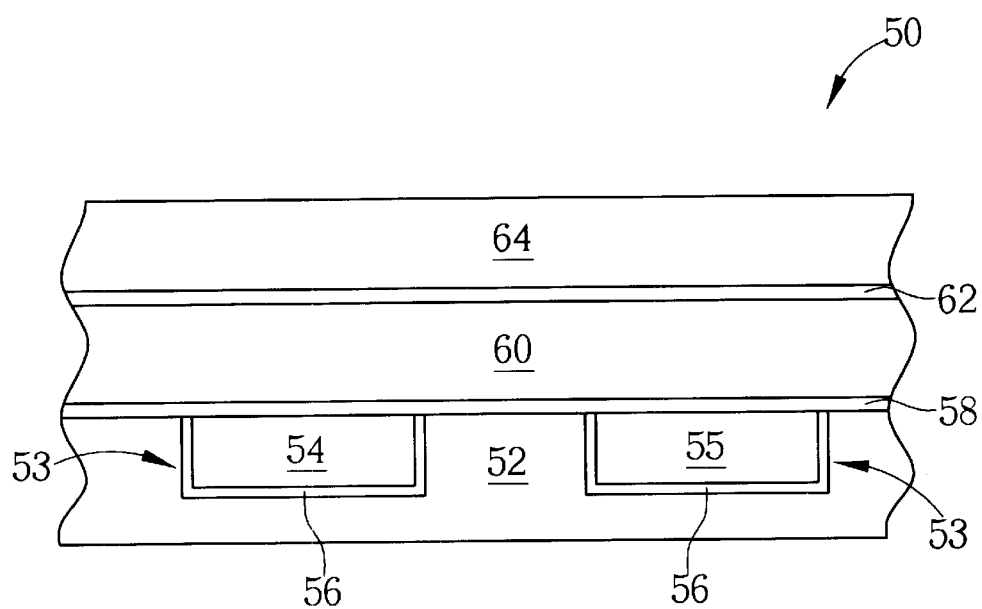
FIG. 10 to FIG. 16 are schematic diagrams of a process for forming a dual damascence structure and a MIM capacitor structure according to the present invention.

Please refer to FIG. 10 to FIG. 16. FIG. 10 to FIG. 16 are schematic diagrams of a process for forming a metal-insulator-metal (MIM) capacitor 84 structure on a semiconductor wafer 50 according to the present invention. As shown in FIG. 10, the semiconductor wafer 50 comprises a first dielectric layer 52 formed on a substrate(not shown). The first dielectric layer 52 further comprises two conductive regions 53, a first conductive layer 54 and a bottom electrode 55 of the MIM capacitor disposed in the two conductive regions 53, respectively. The first conductive layer 54 and the bottom electrode 55 of the MIM capacitor are surrounded by a linear layer 56. The objective of the linear layer 56 is to isolate the first conductive layer 54, the bottom electrode 55 of the MIM capacitor and the first dielectric layer 52, in order to avoid diffusion of metal atoms into the first dielectric layer 52. The linear layer 56 is composed of titanium nitride (TiN), tantalum nitride (TaN) and silicon nitride ($Si_3N_4$) etc. The first conductive layer 54 can be a metal runner, a landing pad, a gate, a drain or a source formed on the semiconductor wafer 50. A barrier layer 58, composed of silicon nitride, is deposited on the semiconductor wafer 50 and covers the surfaces of the first conductive layer 54 and the bottom electrode 55 of the MIM capacitor. A second dielectric layer 60, a stop layer 62 and a third dielectric layer 64 are then sequentially formed on the barrier layer 58. The second dielectric layer 60, the stop layer 62 and the third dielectric layer 64 form a sandwiched structure.

Figure 11:
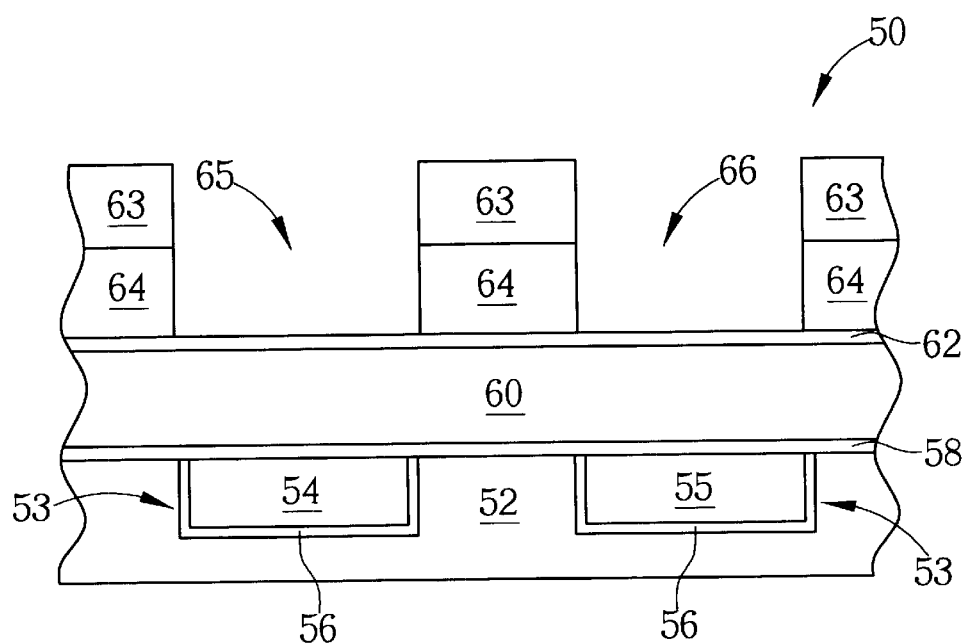

As shown in FIG. 11, a first photolithography process is then performed in order to form a first photoresist layer 63 on the surface of the stop layer 62. The first photoresist layer 63 exposes the portion in the third dielectric layer 64 for forming the runner(not shown) and the top electrode(not shown) of the MIM capacitor. An anisotropic dry etching process is then performed in order to remove a portion of the third dielectric layer 64 not covered by the first photoresist layer 63, down to the surface of the stop layer 62, forming a trench 65 and an opening 66. The opening 66 is used for the MIM capacitor 84 in a subsequent process. The first photoresist layer 63 is removed.

Figure 12:
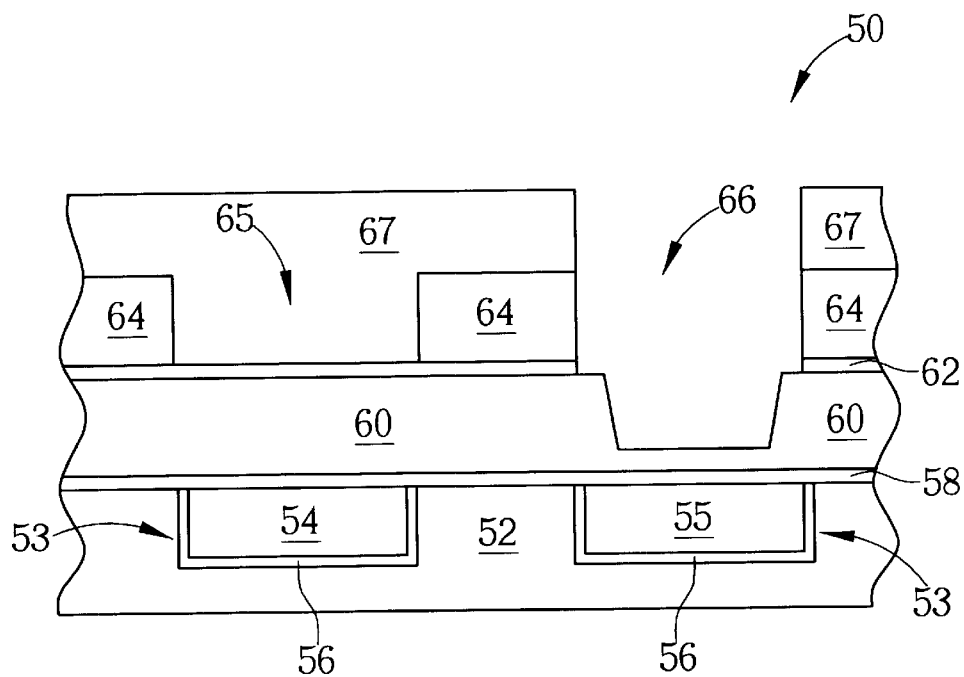
Figure 13:
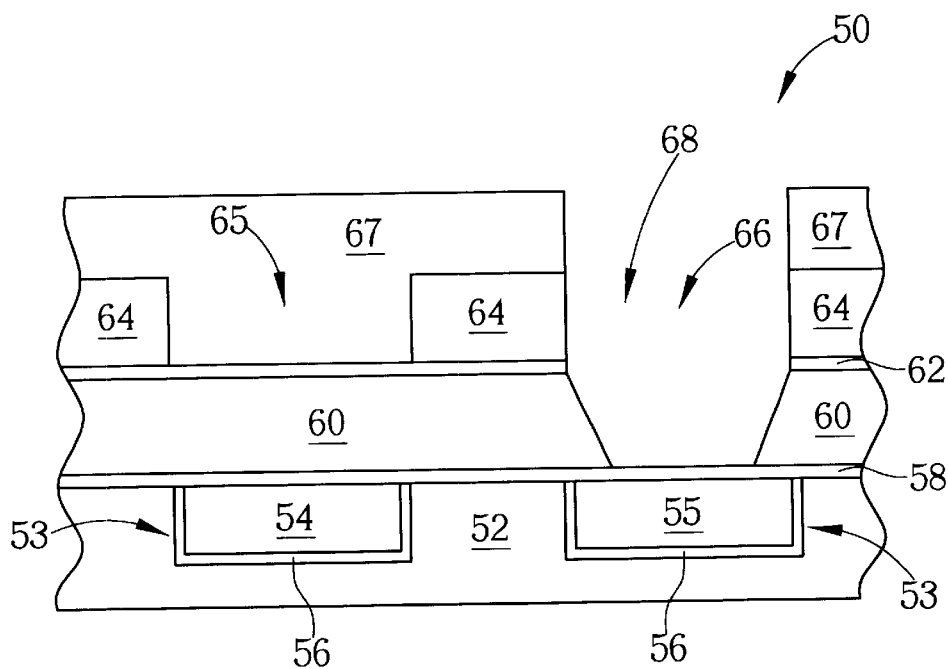

Please refer to FIG. 12 and FIG. 13. A second photolithography process is performed in order to form a second photoresist layer 67 on the surface of the semiconductor wafer 50. The second photoresist layer 67 covers a region outside of the opening 66. Then, a double stage etching process is performed. As shown in FIG. 12, the first stage is a dry etching process. First, the stop layer 62 is anisotropically etched at a bottom of the opening 66 down to the surface of the second dielectric layer 60. Then, some of the etching process parameters need to be adjusted, because the compositions of the second dielectric layer 60 and the stop layer 62 are different. Thereafter, an etching process is performed on the second dielectric layer 60 until the thickness of the second dielectric layer 60 remaining atop the barrier layer 58 in the opening 66 is 500~1000 angstroms.

As shown in FIG. 13, a second stage etching process is then performed. The second stage etching process is a wet etching process and isotropically etches the second dielectric layer 60 in the opening 66 down to the surface of the barrier layer 58 in order to form the opening 68 of the top electrode of the MIM capacitor. In this two stage etching process, anisotropic etching holds the etching depth with very large proportion, therefore the opening 68 of the top electrode formed is a structure with a slant bottom. At the same time, since the second stage wet etching process is added, the barrier layer 58 will not be destroyed by direct bombardment of plasma in the dry etching process. Finally, the second photoresist layer 67 is removed.

Figure 14:
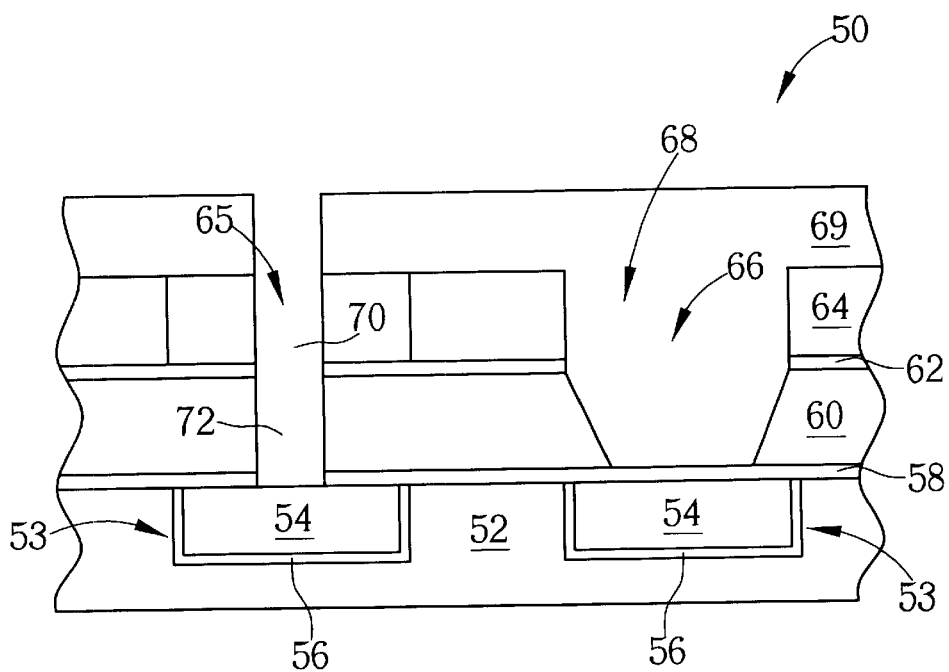

As shown in FIG. 14, a third photolithography process is performed in order to form a third photoresist layer 69 on the surface of the semiconductor wafer 50. The third photoresist layer 69 defines the pattern of a contact opening 70 in the trench 65. An anisotropic second dry etching process is then performed through the contact opening 70 in order to remove the stop layer 62, the second dielectric layer 60 and the barrier layer 58 not covered by the third photoresist layer 69, and to form a contact hole 72. The third photoresist layer 69 is then removed.

Figure 15:
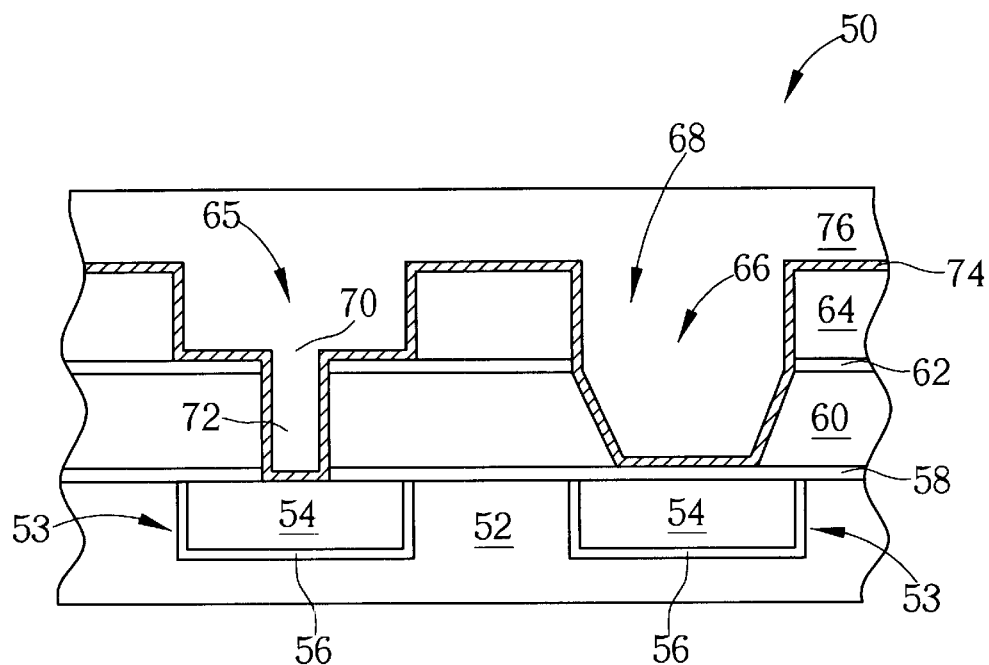

As shown in FIG. 15, a metal barrier layer 74 is then formed on the surface of the contact hole 72, the trench 65 and the opening 68 of the top electrode of the MIM capacitor. The metal barrier layer 74 can be a tantalum nitride layer. Then a copper metal layer 76 is formed on the surface of the metal barrier layer 74 by sputtering. The copper metal layer 76 fills in the contact hole 72, the trench 65 and the opening 68 of the top electrode of the MIM capacitor.

Figure 16:
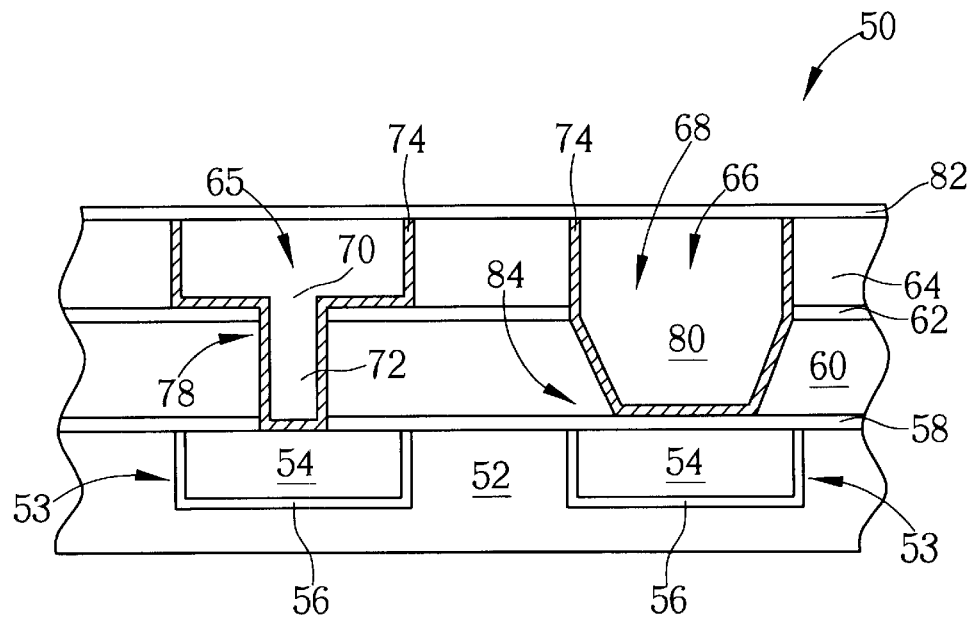

As shown in FIG. 16, a chemical mechanical polishing process is performed in order to remove the copper metal layer 76 atop the third dielectric layer 64, the trench 65 and the opening 68 of the top electrode of the MIM capacitor. The metal barrier layer 74 is then flush with the copper metal layer 76 that is filled into the trench 65 and the opening 68 of the top electrode of the MIM capacitor and the third dielectric layer 64, forming a copper runner 78 and a top electrode 80 of the MIM capacitor. Thereafter, an isolation layer 82 is formed on the surface of the copper runner 78 and the top electrode 80 of the MIM capacitor. The top electrode 80 of the MIM capacitor, the bottom electrode 55 of the MIM capacitor and the barrier layer 58 form a MIM capacitor 84.

The method of forming a MIM capacitor on the surface of the semiconductor wafer according to the present invention uses a dual damascence process. First, a trench opening in the third dielectric layer and an opening related to the MIM capacitor in the subsequent process are formed. Then a two stage etching process is performed to form an opening of the top electrode of the MIM capacitor. After that a contact hole is formed in the trench. Finally, a metal barrier layer and a copper metal layer are formed. The copper metal layer fills in the contact hole, the trench and the opening of the top electrode of the MIM capacitor. A chemical mechanical polishing process and an isolation layer deposition process are then performed to complete the manufacturing of a copper runner and a MIM capacitor.

Compared to the prior art method of forming a dual damascence structure on a semiconductor wafer, the method according to the present invention not only makes a copper runner, but also simultaneously makes a MIM capacitor. Also, the method according to the present invention can avoid the barrier layer and the dielectric layer of the MIM capacitor being destroyed because of direct bombardment of plasma in a dry etching process in the prior art.

Furthermore, the top and bottom electrodes of the MIM capacitor according to the present invention will have very ideal resistivity values, and the area that the MIM capacitor occupies will be shrunk.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a dual damascence runner and a metal-insulator-metal (MIM) capacitor on a semiconcuctor wafer simultaneously, the semiconductor wafer comprising a first dielectric layer, at least a first conductive layer and at least a bottom electrode of the MIM capacitor disposed in the first dielectric layer, the surface of the first conductive layer and the bottom electrode of the MIM capacitor covered by a barrier layer, the method comprising:

forming a second dielectric layer on the surface of the barrier layer;

forming a stop layer on the surface of the second dielectric layer;

forming a third dielectric layer on the surface of the stop layer, wherein the second dielectric layer, the stop layer and the third dielectric layer forms a sandwiched structure;

forming a first photoresist layer on the surface of the third dielectric layer, the first photoresist layer exposes the regions for forming the runner and the top electrode of the MIM capacitor in the third dielectric layer;

etching the third dielectric layer not covered by the first photoresist layer down to the stop layer anisotropicaly so as to form a trench and an opening in the third dielectric layer above the conductive layer and the bottom electrode of the MIM capacitor respectively;

removing the first photoresist layer completely;

forming a second photoresist layer on the surface of the semiconductor wafer, the second photoresist layer covers the region outside the opening;

etching the stop layer and the second dielectric layer at the bottom of the opening down to the surface of the barrier layer so as to form an opening of the top electrode of the MIM capacitor in the third dielectric layer, the stop layer and the second dielectric layer;

removing the second photoresist layer completely;

forming a third photoresist layer on the surface of the semiconductor wafer, the third photoresist layer forms a contact opening in the trench;

etching the stop layer, the second dielectric layer and the barrier layer via the contact opening down to the surface of the first conductive layer so as to form a contact hole in the stop layer, the second dielectric layer and the barrier layer; and removing the third photoresist layer.

2. The method of claim 1 wherein the method for etching the stop layer and the second dielectric layer at the bottom of the opening down to the surface of the barrier layer is an anisotropic dry etching process.

3. The method of claim 1 wherein the method for etching the stop layer and the second dielectric layer at the bottom of the opening down to the surface of the barrier layer comprising the following steps:

etching the stop layer at the bottom of the opening anisotropically down to the surface of the second dielectric layer;

changing the etching parameters and etching the second dielectric layer continuously so as to the thickness of the second dielectric layer remaining atop the barrier layer is between 500 and 2000 angstroms; and etching the second dielectric layer in the opening down to the surface of the barrier layer isotropically.

4. The method of claim 3 wherein the thickness of the second dielectric layer remaining atop the barrier layer is 1000 angstroms after etching the second dielectric layer anisotropically.

5. The method of claim 3 wherein a slant bottom is resulted from the anisotropic etching of the second dielectric layer.

6. The method of claim 1 wherein the first conductive layer is a copper runner of lower level.

7. The method of claim 1 wherein the bottom electrode of the MIM capacitor is composed of copper.

8. The method of claim 1 wherein the method further comprising the following steps after removing the third photoresist layer:

forming a metal barrier layer on the surface of the contact hole, the trench and the opening of the top electrode of the MIM capacitor;

sputtering a copper metal layer on the surface of the barrier layer and fills in the contact hole, the trench and the opening of the top electrode of the MIM capacitor;

performing a metal chemical-mechanical-polishing (metal CMP) process so as to planarize the copper metal layer filled in the trench and the opening of the top electrode of the MIM capacitor and form a copper runner and an top electrode of MIM capacitor respectively; and forming an isolation layer on the surface of the copper runner and the top electrode of the MIM capacitor;

wherein the top electrode of the MIM capacitor, the barrier layer and the bottom electrode of the MIM capacitor form a MIM capacitor.

9. The method of claim 8 wherein the metal barrier layer comprises a tantalum nitride layer.

* * * * *